US006721914B2

(12) United States Patent
Bartenstein et al.

(10) Patent No.: US 6,721,914 B2
(45) Date of Patent: Apr. 13, 2004

(54) DIAGNOSIS OF COMBINATIONAL LOGIC CIRCUIT FAILURES

(75) Inventors: Thomas W. Bartenstein, Owego, NY (US); Douglas C. Heaberlin, Underhill, VT (US); Leendert M. Huisman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 09/827,425

(22) Filed: Apr. 6, 2001

(65) Prior Publication Data

US 2002/0147952 A1 Oct. 10, 2002

(51) Int. Cl.$^7$ ................................................ G01R 31/28
(52) U.S. Cl. ......................................... 714/734; 714/25
(58) Field of Search ............................ 714/25, 37, 799, 714/734, 735, 737, 41

(56) References Cited

U.S. PATENT DOCUMENTS

| | | | | |
|---|---|---|---|---|
| 4,857,833 | A | | 8/1989 | Gonzalez et al. .............. 324/73 |
| 5,127,006 | A | | 6/1992 | Subramanian et al. ...... 714/800 |
| 5,189,365 | A | * | 2/1993 | Ikeda et al. .................... 714/33 |
| 5,410,548 | A | * | 4/1995 | Millman ....................... 714/741 |
| 5,570,376 | A | * | 10/1996 | Kunda et al. ................ 714/736 |
| 5,587,930 | A | | 12/1996 | Hori et al. ............. 364/551.01 |
| 5,640,403 | A | | 6/1997 | Ishiyama et al. ............ 714/737 |
| 6,532,440 | B1 | * | 3/2003 | Boppana et al. .............. 703/14 |
| 6,553,329 | B2 | * | 4/2003 | Balachandran .............. 702/118 |

OTHER PUBLICATIONS

Diagnosing Realistic Bridging Faults with Single Stuck–at Information, Lavo et al., pp. 255–268, IEEE Transactions on Computer–Aided Design of Integrated Circuits and Systems, vol. 17, No. 3, Mar. 1998.
Multi–Chip Module Test and Diagnostic Methodology, Curtin et al., pp. 27–34, IBM J. Res. Develop. vol. 27, No. 1, Jan. 1983.
Failure Diagnosis of Structured VLSI, Waicukauski et al., Aug. 1989, pp. 49–60, IEEE Design & Test of Computers.
Diagnosing CMOS Bridging Faults with Stuck–At Fault Dictionaries, Millman et al., 1990, pp. 860–870, 1990 International Test Conference.

* cited by examiner

*Primary Examiner*—Albert Decady
*Assistant Examiner*—Esaw Abraham
(74) *Attorney, Agent, or Firm*—Schmeiser, Olsen & Watts; Robert A. Walsh

(57) ABSTRACT

A method for diagnosing defects in an integrated circuit comprising: providing a set of failing test patterns; for each failing test pattern in the set of test patterns determining if a single stuck-at fault could cause the failing test pattern and determining a node on which a defect causing the single stuck-at fault could reside; selecting those failing test patterns that could be caused by a single stuck-at fault; and for those selected failing test patterns determining a first set of sets of nodes, such that each of the selected failing test patterns could be caused by a stuck-at zero or a stuck-at one on at least one node from each set of nodes from the first set of sets of nodes.

12 Claims, 8 Drawing Sheets

DIAGNOSIS OF COMBINATIONAL LOGIC CIRCUIT FAILURES

FIELD OF THE INVENTION

The present invention relates to the field of fault diagnosis; more specifically, it relates to a method for diagnosis of points of failure in complex electronic devices such as combinational logic circuits.

BACKGROUND OF THE INVENTION

When an integrated circuit (IC) fails one or more tests, it is of great interest to determine what caused the failure. Such a root cause analysis can point to unexpected and unwanted design sensitivities, to process deficiencies, or to the undesirable but usually unavoidable presence of random defects. In the first two cases, the failure diagnosis is used to drive a change in the design or the process, in the latter, information is used to improve manufacturing yield projections.

Standard techniques exist to analyze the data collected during test, and to derive locations of the defects in the IC. The general approach is to construct a set of potential defects that could explain the observed fail data, translate those defects into logic faults that can be simulated on a fault simulator, simulate all the faults in the list and then compare the simulated results against the data that is collected at the tester. The logic faults that match the test data most closely are assumed to correspond to the real defect.

Even though this approach is relatively successful, there are several problems that are rapidly becoming more apparent with decreasing feature sizes, and with increasingly aggressive design styles that deviate more and more from the robustly digital behavior assumed by logic simulators. The most serious one of those problems is that, in practice, only single stuck-at faults are used. Stuck-at fault models are suitable for logic simulation and they can be efficient in uncovering defects, even when those defects do not themselves correspond to stuck-at faults.

A stuck-at 0/stuck-at 1 models a defect that affects a single node by forcing the logical value at that node to be a zero or a one. Stuck-at faults are very restrictive as models of defects because they assume the defect influences only one node, is active all the time and behaves in one particular way. Using combinations of stuck-at faults removes the first of these drawbacks, but does little to alleviate the others. For example, bridging and intermittent defects cannot be modeled by any combination of stuck-at faults.

The problem in logic diagnostics is how to model real defects by logical abstractions that faithfully mimic the behavior of the defect, but that can also be simulated efficiently by diagnostic simulators.

Terms and Definitions

Circuit elements are gates or latches and define logic blocks. Each logic block has input pins and output pins. Blocks are connected to nets by pins. Often a net is referred to by the output pin number of the feeding logic block. A test pattern is a vector of 0's and 1's that is applied to the input of the first logic block(s) of a set of combinational logic blocks. After progressing through the set of combinational logic blocks the pattern that appears on the output pin of the last logic block(s) of the set of combinational logic blocks is either an expected pattern (a pass pattern) or an un-expected pattern (a fail pattern.) A fault (or logic fault) is a model of the defect causing the fail pattern. Whenever node is used hereafter, it may be read as pin or as net, depending upon the software package employed to do fault diagnostics. Stuck-at faults in particular are logical models of defects that affect a single node and that force a value on the node. Diagnostics tries to determine what type of fault on what nodes(s) of the set of combinational logic blocks would explain the fail pattern.

SUMMARY OF THE INVENTION

The approach to logic diagnosis of the present invention is based on the following: a defect is known to be active only when the IC fails a test pattern. When an IC fails a test pattern, the defect that caused the fail behaves as if it were a collection of one or more stuck-at faults, the set of stuck-at faults being unique for that test pattern both in their location (pins) and their polarities. The present invention identifies the minimum set of nodes that could be affected by the defect.

A method for diagnosing defects in an integrated circuit comprising: providing a set of failing test patterns; for each failing test pattern in the set of test patterns determining if a single stuck-at fault could cause the failing test pattern and determining a node on which a defect causing the single stuck-at fault could reside; selecting those failing test patterns that could be caused by a single stuck-at fault; and for those selected failing test patterns determining a first set of sets of nodes, such that each of the selected failing test patterns could be caused by a stuck-at zero or a stuck-at one on at least one node from each set of nodes from the first set of sets of nodes.

A second aspect of the present invention is a method for diagnosing defects in an integrated circuit comprising:(a) providing a set of failing test patterns and a set of main faults; (b) selecting a failing test pattern from the set of failing patterns; (c) creating one or more single-stuck at fault target faults and adding the target faults to a set of target faults; (d) selecting a target fault from the set of target faults; (e) simulating the selected target fault against a fault machine to create a simulated fail pattern; (f) comparing the simulated fail pattern to the selected fail pattern; (g) if the simulated fail pattern matches the selected failing pattern, adding the selected target fault to a explaining node list otherwise going to step (h); (h) repeating steps (d) through (g) until all target faults in the set of target faults have been selected; (i) repeating steps (b) through (h) until all failing test patterns in the set of failing test patterns have been selected; (j) selecting in turn, each simulated fault from the fault list, determining the associated nodes and creating sets of nodes; and (k) selecting a first set of sets of nodes such that each the simulated fail pattern matching a selected failing pattern could be caused by a stuck-at zero or a stuck-at one on at least one node from each set of nodes from the first set of sets of nodes.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
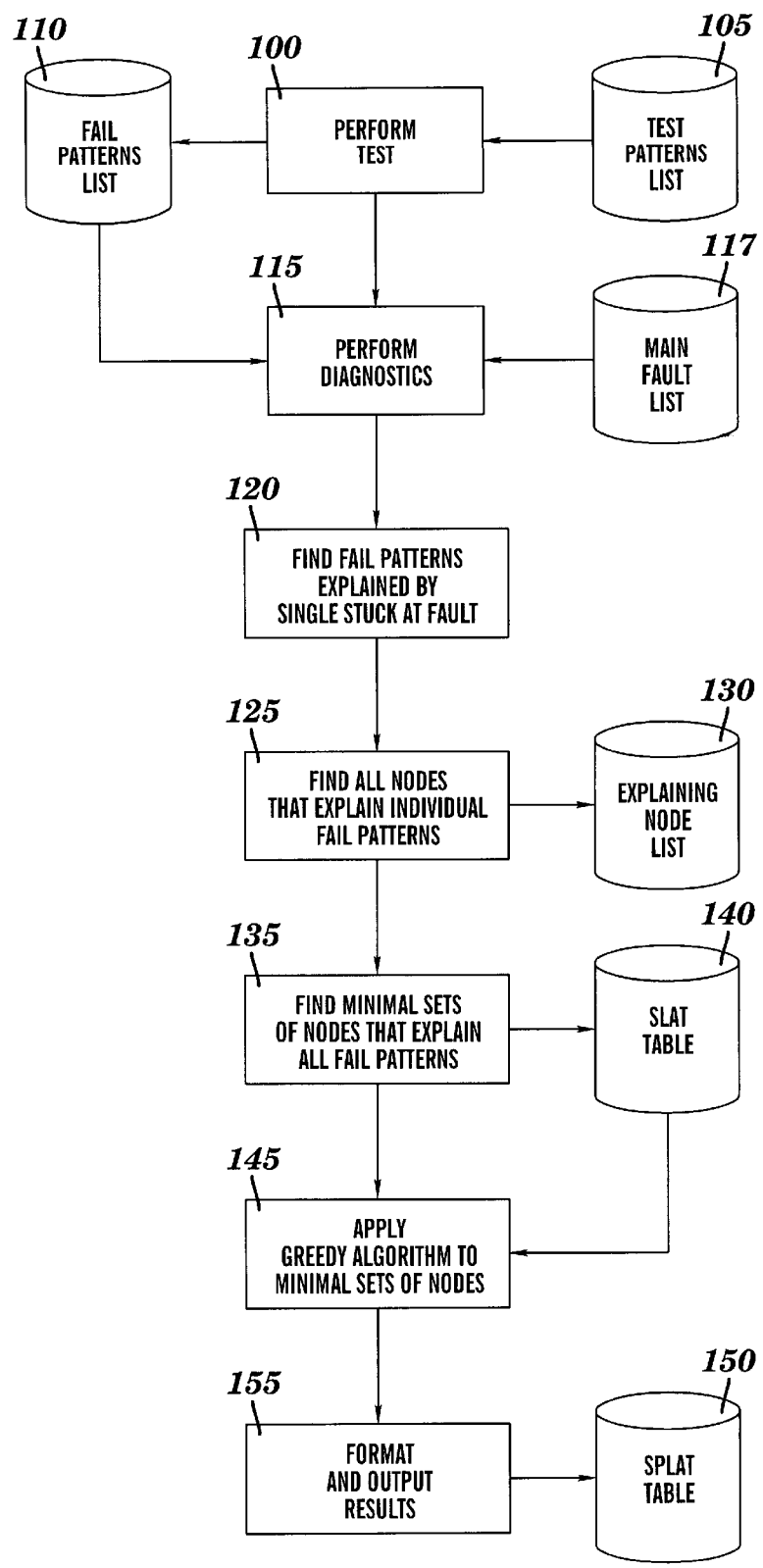
FIG. 1 is a flowchart showing the major steps of failure diagnosis according to the present invention.
Figure 6:
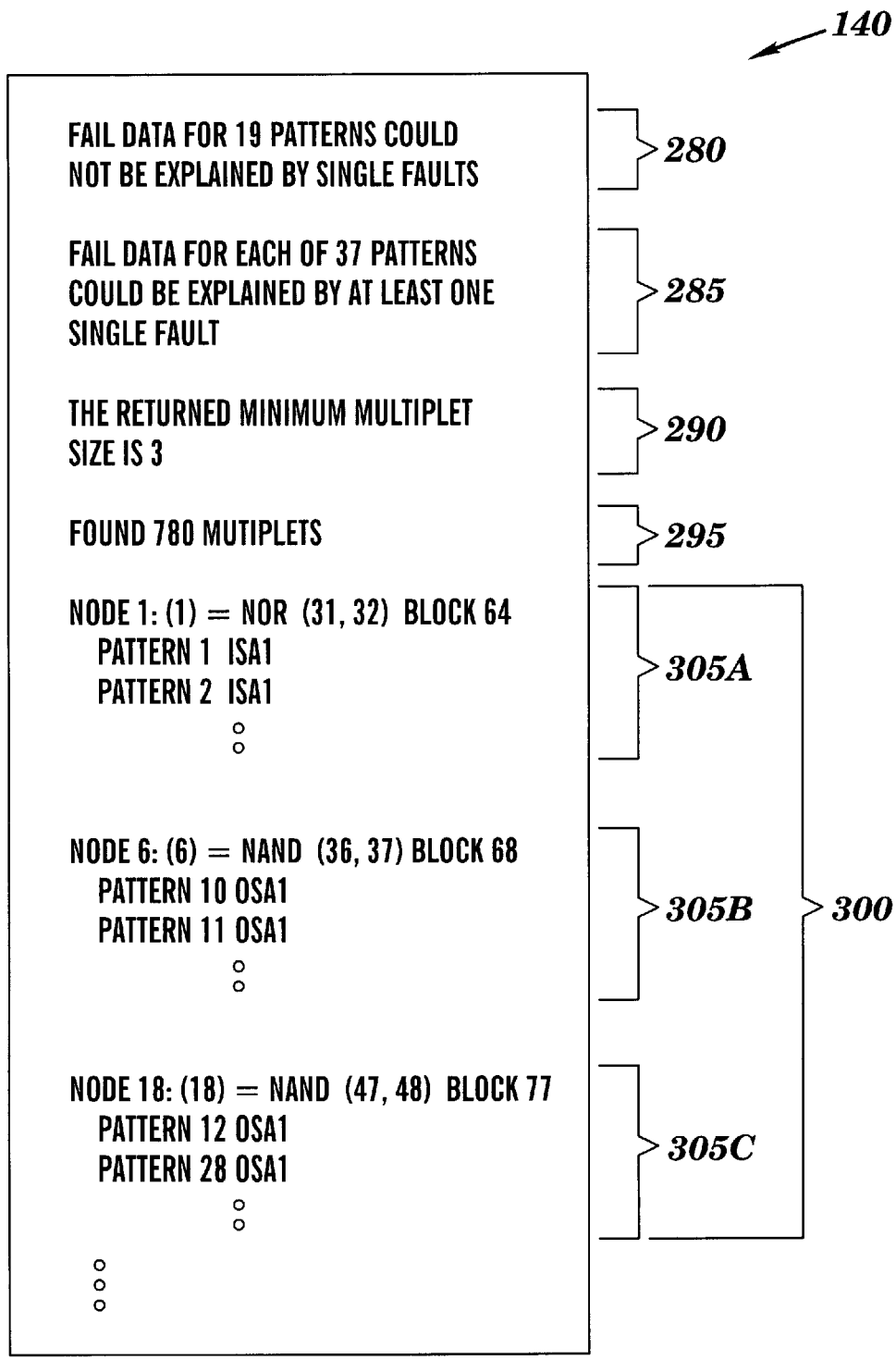
FIG. 6 is a diagram illustrating an example of the data stored in SLAT table 140 according to the present invention.
Figure 10:
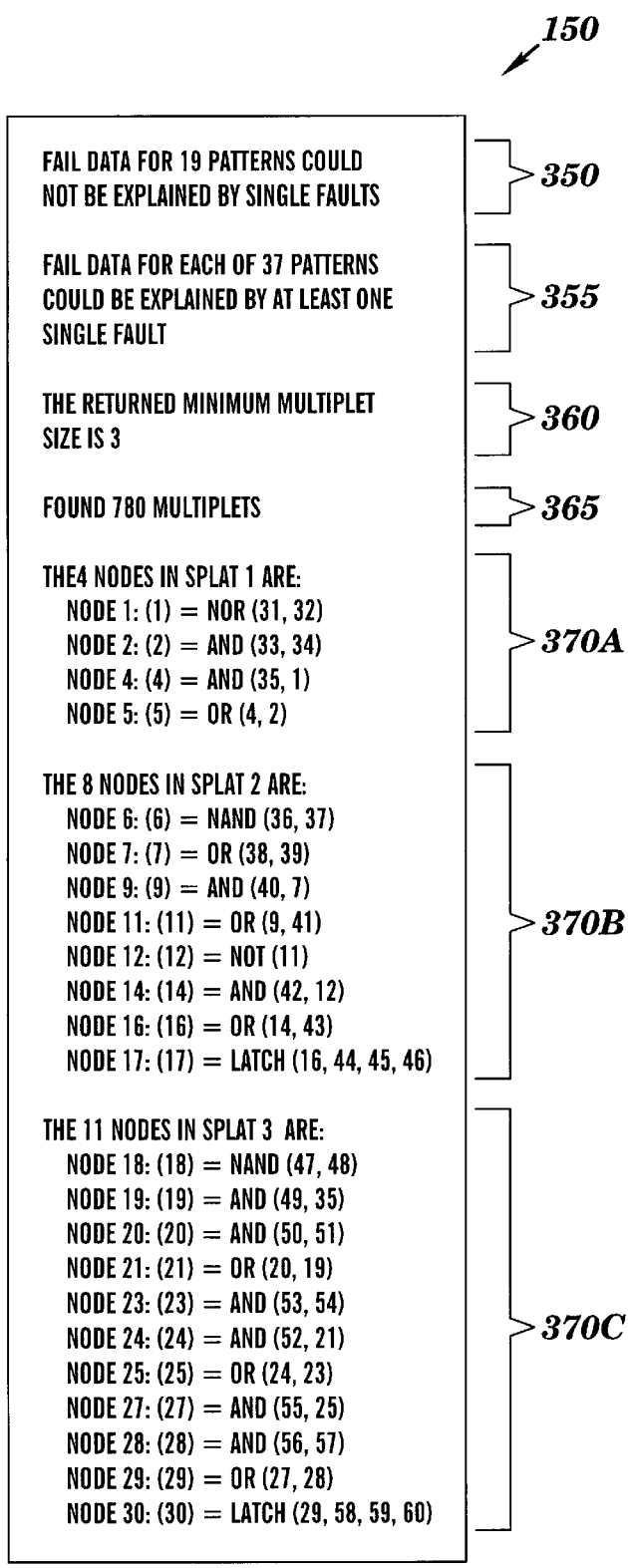
FIG. 10 is a diagram illustrating an example of the data stored in splat table 150 according to the present invention.

Turning to FIG. 1, FIG. 1 is a flowchart showing the major steps of failure diagnosis according to the present invention. In step 100, a test is performed on a combinational logic circuit by applying test patterns list 105 to the circuit in a tester and collecting resulting fail patterns list 110. In step 115, single stuck-at fault diagnostics is performed separately on each fail of fail patterns list 110 using a main fault list 117. In step 120, all the fail patterns explained by single stuck-at faults are found. In step 125, all nodes on which the single stuck-at faults found in step 120 can reside are found and stored in a explaining node list 130. Next in step 135, the minimal sets of nodes that explain all failing test patterns found in step 120 as a group are found in order to create a SLAT (Single Location At a Time) table 140. A set of nodes is minimal if there is no other set of nodes with fewer nodes that also explains all failing patterns in fail patterns list 110 found in step 120. A minimal set of nodes is a multiplet. SLAT table 140 is illustrated in FIG. 6 and discussed below. In step 145, a "greedy" algorithm is applied to the minimal sets of nodes. In step 155, the output of the "greedy" algorithm is formatted to create a splat table 150. Splat table 150 is illustrated in FIG. 10 and will be illustrated in FIG. 9, and defined and discussed below.

Figure 2:
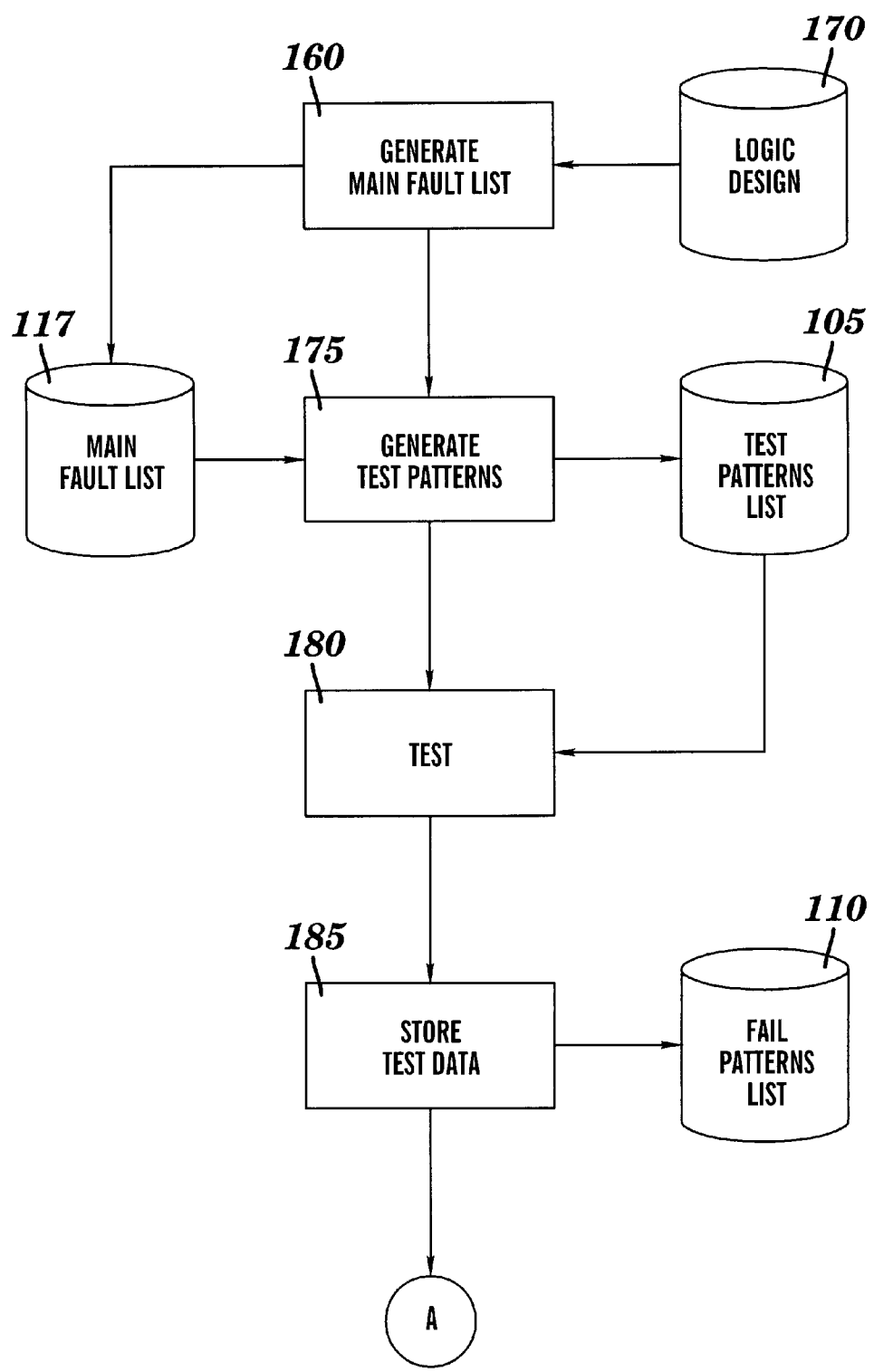
FIG. 2 is a flowchart showing in detail the procedure of step 100 of the flowchart shown in FIG. 1.

FIG. 2 is a flowchart showing in detail the procedure of step 100 of the flowchart shown in FIG. 1. In step 160, main fault list 117 is generated from a logic design 170 by a fault generation program. Main fault list 117 contains at least all the stuck-at faults on all the nodes in the logic design. Logic design 170 contains complete descriptions of the interconnections of logic blocks and nets. In step 175, test patterns list 105 is generated from main fault list 117 by a test pattern generation program. In step 180, test patterns list 105 is applied to the set of combinational logic blocks to be tested by a tester. In step 185, fail patterns list 110 is stored. Fail patterns list 110 includes the identity of those logic blocks having an incorrect value on their output after application of the test data as well as the failing patterns themselves.

Figure 3:
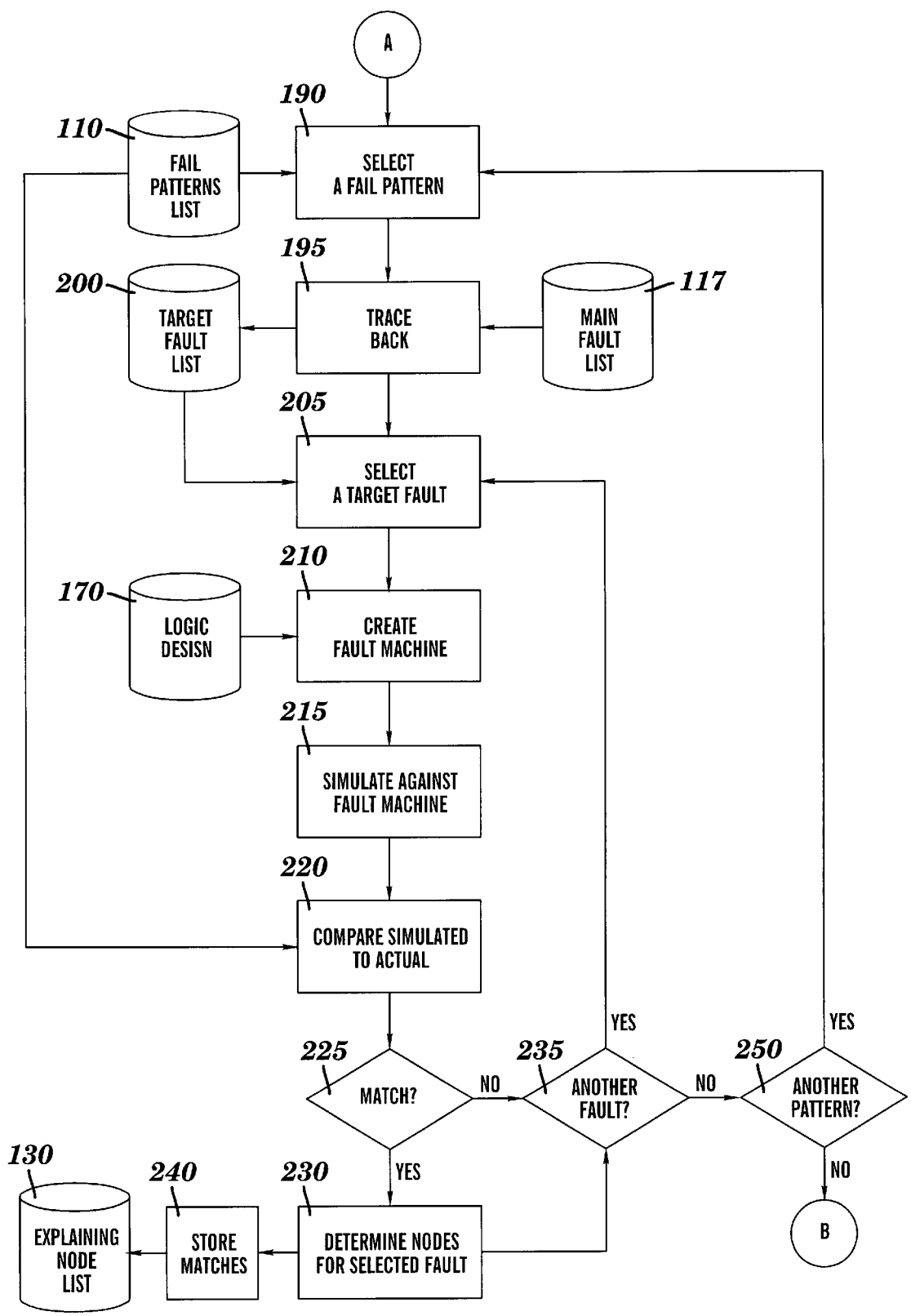
FIG. 3 is a flowchart showing in detail the procedure of steps 115, 120 and 125 of the flowchart shown in FIG. 1.
Figures 4, 5:
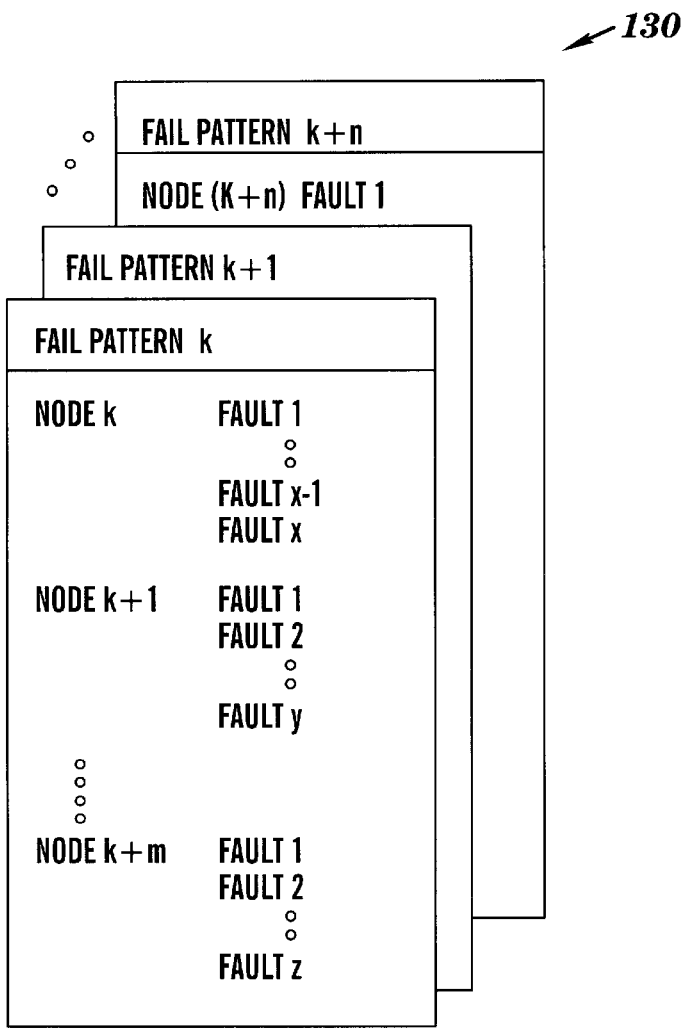
FIG. 4 is a diagram illustrating the data stored in explaining node list 130 according to the present invention.
FIG. 5 is a simplified version of the diagram of FIG. 4.

FIG. 3 is a flowchart showing in detail the procedure of steps 115, 120 and 125 of the flowchart shown in FIG. 1. In step 190 a single fail pattern is selected from fail patterns list 110. Next in step 195, a target fault list 200 is generated using main fault list 117. Target fault list 200 contains a list of all single stuck-at faults that could cause any of the incorrect values in the selected failing pattern. For example, if the values in N positions of an X position fail pattern are incorrect, faults to explain each of the N values must be found and added to target fault list 200. Individual target faults in target fault list 200 are selected by back tracing. The back trace begins at the failing logic block output and terminates at a previous latch. Next in step 205, a single fault is selected from target fault list 200. Then in step 210, a fault machine is created by modifying logic design 170 to introduce the selected fault. In step 215, the selected target fault is simulated against the fault machine and a simulated fail pattern generated. In step 220, the simulated fail pattern is compared to the selected fail pattern (actual fail pattern). Then in step 225 a decision is made as to whether the simulated fail pattern matches the selected fail pattern. If in step 225, there is a match, then in step 230 the node identities of the target fault are determined and in step 240, stored in explaining node list 130, otherwise the method proceeds to step 235. Other data that may be stored in explaining node list 130 includes faults. Explaining node list 130 is illustrated in FIG. 4 and discussed below. Returning to step 235, if another fault remains unselected in target fault list 200, the method loops back to step 205 and the next target fault is selected from the target fault list, otherwise the method proceeds to step 250. In step 250, if another fail pattern remains unselected in fail patterns list 110, the method loops back to step 190 and the next fail pattern is selected from the fail patterns list, otherwise the method continues to step 310 of FIG. 7.

FIG. 4 is a diagram illustrating the data stored in explaining node list 130 according to the present invention. In FIG. 4, explaining node list 130 is comprised of fail patterns "k" through "k+n." Using fail pattern "k" as an example, under fail pattern "k" are nodes "k" to "k+m." Under node "k" are faults "1" to "x", under node "k+1 are faults "1" to "y" and under node "k+m" are faults "1" to "z." The fault information is optional.

FIG. 5 is a simplified version of the diagram of FIG. 4. In matrix 275, there are four fail patterns labeled A, B, C and D. There are six nodes labeled one through six. For each fail pattern the node number that had an incorrect value in the simulation is marked with an "X." For fail pattern A, the nodes are 1 and 3, for fail pattern B, the nodes are 2, 4 and 5, for fail pattern C, the nodes are 1 and 2 and for fail pattern D, the nodes are 2, 4 and 6. There are four sets of nodes that "explain" all four fail patterns. That is, faults on all of the nodes in any of the sets would result in all four of the fail patterns. The sets of nodes are 1 and 2, 1 and 4, 2 and 3 and 1, 5 and 6. The lowest size is 2, so the set 1, 5, and 6 is discarded. The sets 1 and 2, 1 and 4 and 2 and 3 would be written to SLAT table 140.

FIG. 6 is a diagram illustrating an example of the data stored in SLAT table 140 according to the present invention. FIG. 6 is presented, as it would format for optional output. SLAT table 140 includes a first statement 280 of the number of non-SLAT patterns found, that is fail patterns that can not be "explained" by one or more stuck-at faults, a second statement 285 of the number of SLAT patterns found, that is fail patterns that can be "explained" by one or more stuck-at faults, a third statement 290 of the minimum multiplet size and a fourth statement 295 of the total number of multiplets. In this example, 19 patterns were non-SLAT patterns, 37 SLAT patterns, the multiplet size is 3 and the number of multiplets is 780.

Illustrated in SLAT table 140 is a first multiplet 300. First multiplet 300 includes first node data 305A, second node data 305B and third node data 305C. First node data 305A includes, as do second and third node data 305B and 305C, the reference number of the node that explains the failing pattern listed, the output node reference number, the logic block type, the input nodes reference number(s), and the reference number of the logic block on which the explaining node resides, as well as a plurality of fail pattern number/fault type listings. In this example, first node data 305A is read as follows: the node on which the fault resides is 1, the output node is 1, the logic block type is NOR, the input nodes are 31 and 32, and the logic block reference number is 64. Two of the fail patterns are pattern 1, input stuck-at 1 and pattern 2, input stuck-at 1.

Figures 7, 8, 9:
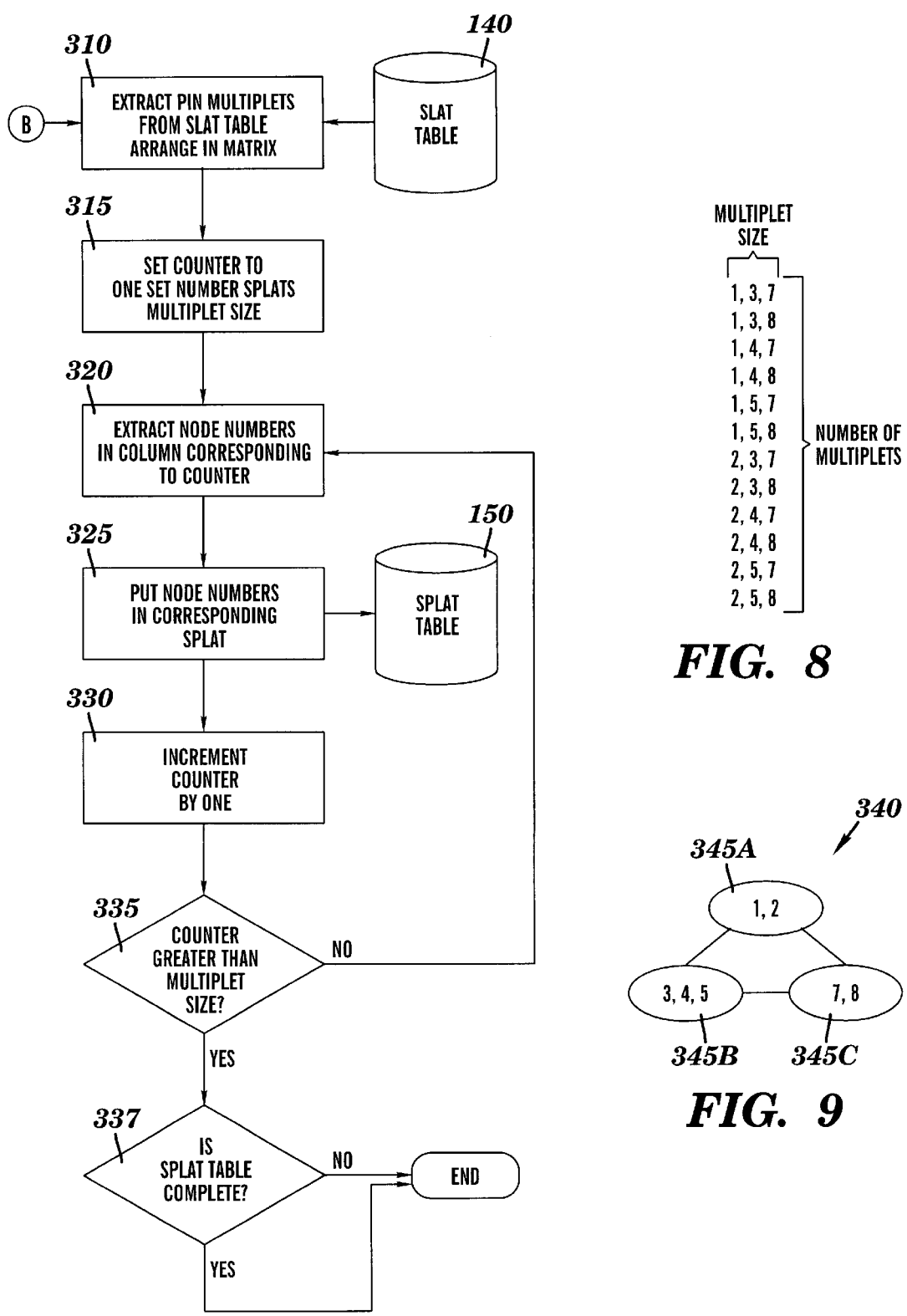
FIG. 7 is a flowchart showing in detail the procedure of step 145 of the flowchart shown in FIG. 1.
FIG. 8 is a diagram showing a simple example of a multiplet matrix as would be created in step 310 of the flowchart shown in FIG. 7.
FIG. 9 is a splat diagram illustrating the set of multiplets derived from the multiplet matrix illustrated in FIG. 8.

FIG. 7 is a flowchart showing in detail the procedure of step 145 of the flowchart shown in FIG. 1. In step 310, the output node reference number is extracted from each multiplet 300 and arranged in a multiplet matrix. The order in which nodes are arranged in the multiplet matrix is such that nodes that explain more failing patterns are listed before nodes that explain fewer failing patterns. The number of columns in the multiplet matrix is equal to the multiplet size 290 and the number of rows is equal to the number of multiplets 300 in SLAT table 140. In the example of FIG. 6, the first row of the multiplet matrix is 1, 6, 18. FIG. 8 illustrates a multiplet matrix for a simple example. In step 315, a counter is set to one and a number of splats is set to the multiplet size (from third statement 290.) Next in step 320, the nodes reference numbers of the output nodes in the column of the multiplet matrix corresponding to the counter value are extracted and in step 325, added to the corresponding Splat of splat table 150. The logic block type and the input node's reference number (from SLAT table 140) associated with each output node's may also be added to Splat table 150. In step 330, the counter is incremented by one. If, in step 335, the value of the counter is less than or equal to the number of Splats then the process loops back to step 320. If, in step 335, the value of the counter is greater than the number of Splats then the process terminates. In step 337, it is determined if the set of multiplets is complete, that is, if each multiplet that can be obtained by taking one node from each splat corresponds to a multiplet in SLAT table 140. If not, the set of multiplets is called incomplete. In the example of FIG. 6, there are three splats (from third statement 290.) Of course, it is not necessary to construct a multiplet matrix; Splat table 150 can be constructed directly from SLAT table 140 with the proper software routine. However, the multiplet matrix is useful to understand the process of constructing Splat table 150.

FIG. 8 is a diagram showing a simple example of a multiplet matrix as would be created in step 310 of the flowchart shown in FIG. 7. In FIG. 8, the multiplet size is three and the number of multiplets is 12. Nodes 1 through 5, 7 and 8 each explain some pattern fails as single stuck-at faults. Each multiplet comprises a set of nodes, and all the multiplets together comprise a set of sets of nodes. Note, while a given node's reference number may repeat in each column, any given node's reference number may appear in only one column.

FIG. 9 is a splat diagram illustrating the set of splats derived from the multiplet matrix illustrated in FIG. 8. In FIG. 9, splat diagram 340 is comprised of a first splat 345A, a second splat 345B and a third splat 345C. The node reference numbers contained in first splat 345A are 1 and 2 (see column one of FIG. 8). The node reference numbers contained in second splat 345B are 3, 4 and 5 (see column two of FIG. 8). The node reference numbers contained in third splat 345C are 7 and 8 (see column three of FIG. 8).

FIG. 10 is a diagram illustrating an example of the data stored in Splat table 150 according to the present invention. Continuing with the example of FIG. 6, splat table 150 includes a first statement 350 of the number of non-SLAT patterns found, that is fail patterns that can not be "explained" by one or more stuck-at faults, a second statement 355 of the number of SLAT patterns found, that is fail patterns that can be "explained" by one or more stuck-at faults, a third statement 360 of the minimum multiplet size and a fourth statement 365 of the total number of multiplets. In this example, 19 patterns were non-SLAT patterns, 37 SLAT patterns, the multiplet size is three and the number of faults is 780.

Illustrated in Splat table 150 is a first splat 370A. First splat 370A includes the reference number of the nodes that explain the fails listed, the output nodes, the logic block types and the input nodes of the logic blocks on which the explaining node resides. Second splat 370B includes the reference number of the nodes that explain the fails listed, the output nodes, the logic block types and the input nodes of the logic blocks on which the explaining node resides. Third splat 370C includes the reference number of the nodes that explain the fails listed, the output nodes, the logic block types and the input nodes of the logic blocks on which the explaining node resides.

Figure 11:
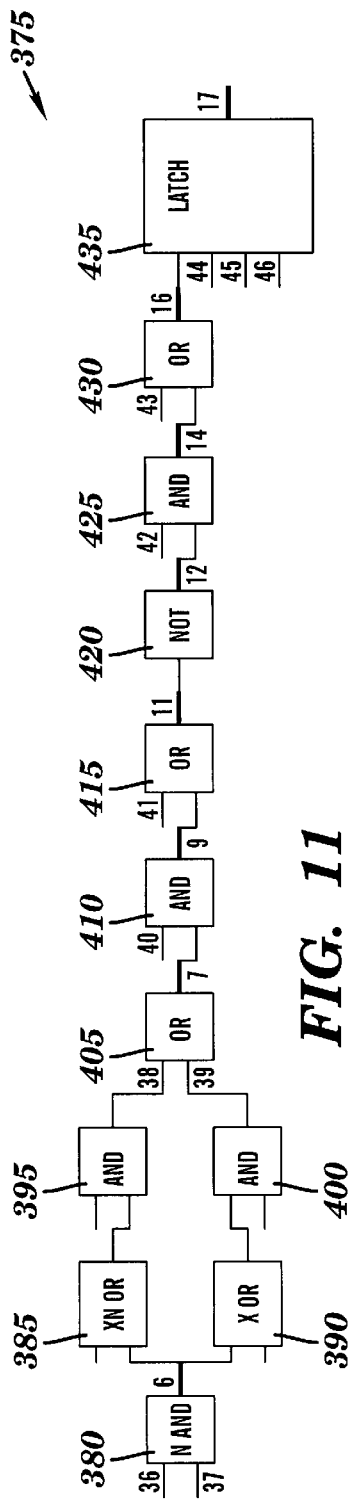
FIG. 11 is a schematic circuit diagram illustrating a portion of the combinational logic circuit corresponding to second Splat 370B of the diagram shown in FIG. 10.

FIG. 11 is a schematic circuit diagram illustrating a portion of the combinational logic circuit corresponding to second splat 370B of the diagram shown in FIG. 10. Circuit 375 is part of a larger combinational logic circuit. The nodes with potential single stuck-at faults for second splat 370B, however, lie only in the portion shown. Circuit 375 comprises a NAND gate 380 having inputs "36" and "37" and having a output node "6" coupled to an input node of XNOR gate 385 and to an input node of XOR gate 390. The output node of XNOR gate 385 is coupled to an input node of AND gate 395. The output node of XOR gate 390 is coupled to an input node of AND gate 400. The output nodes of AND gate 395 is coupled to input nodes "38" of OR gate 405. The output node of AND gate 400 is coupled to input node "39" of OR gate 405. The output node "7" of OR gate 405 is coupled to an input node of AND gate 410. The output node "9" of AND gate 410 is coupled to an input node of OR gate 415. The output node "11" of OR gate 415 is coupled to an input node of NOT gate 420. The output node "12" of NOT gate 420 is coupled to an input node of AND gate 425. The output node "14" of AND gate 425 is coupled to an input node of OR gate 430. The output node "16" of OR gate 430 is coupled to an input node of LATCH gate 435. Latch 435 has a output node "17." The eight "nodes" of Splat 370B are "6", "7", "9", "11", "12", "14", "16" and "17."

Figure 12:
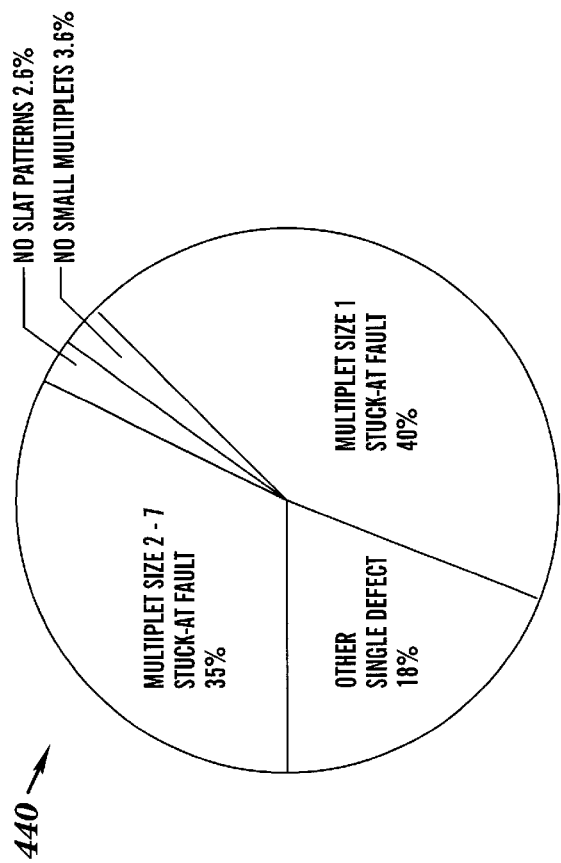
FIG. 12 is a chart illustrating fault distribution in an actual example of a failure diagnosis performed according to the present invention.

FIG. 12 is a chart illustrating fault distribution in an actual example of a failure diagnosis performed according to the present invention. A large experiment was conducted to estimate the efficacy of the diagnosis method of the present invention and to compare it with that of a standard stuck-at fault diagnosis, in this case TestBench (IBM Corporation, Endicott, N.Y.). The combinational logic device was a medium sized Level Sensitive Scan Design (LSSD) Application Specific Integrated Circuit (ASIC) design with about 300,000 logic blocks and having about 900,000 stuck-at faults. In one lot of 15 wafers, 507 failing devices were found to be defective only when logic patterns were applied. Of the 507 failing devices, standard diagnostics found 203 could be explained by at least one single stuck-at fault.

The method of the present invention was applied to all these failing devices. To reduce excessive run times, the size of the multiplets was restricted to seven. The resulting distribution of multiplet sizes is shown in chart 440 of FIG. 12. In chart 440, for 13 (2.6%) of the failing devices no SLAT patterns (more than a single node was affected) were found, 203 (40%) had single stuck-at faults (multiplets of size 1), 179 (35%) had multiplets of size 2 to 7 and 94 (18%) had single node defects that behaved as stuck-at 0 faults on some patterns but as stuck-at 1 on other patterns.

Chart 440 demonstrates the much larger efficiency of the diagnostic method of the present invention compared to regular diagnostics. The number of failing devices for which the diagnostic method of the present invention found at least one multiplet was about 94% of the total number of failing devices, compared to an efficiency of about 40% for standard diagnostics. More strikingly, the number of failing devices for which diagnostic method of the present invention found multiplets of size one is about 60% of the total. Part of this 60% were the devices for which regular diagnostics was successful as well, because a single stuck-at fault that explains all failing patterns was also found by the present invention. The remainder, about 18% of the total, were those devices in which the defect did affect a single node, but not in a consistent manner.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method for diagnosing defects in an integrated circuit comprising:

providing a set of failing test patterns, each failing test pattern comprising a set of values, one or more of said values being incorrect compared to a corresponding value of a set values from a corresponding expected set of passing test patterns;

for each failing test pattern in said set of test patterns determining if any single stuck-at fault could potentially cause at least one of said one or more incorrect values of said failing test pattern and for each failing test pattern determined to have potentially been caused by any single stuck-at fault, determining a set of nodes of a circuit generating said failing test patterns corresponding to said at least one of said one or more incorrect values, a node being a connection between two gates or two latches or a gate and a latch of a circuit generating said set of failing test patterns;

selecting all failing test patterns for which said sets of nodes corresponding to said at least one of said one or more incorrect values were determined; and for those selected failing test patterns determining a first set of sets of nodes, such that all incorrect values of said selected failing test patterns could be caused by a stuck-at zero or a stuck-at one on at least one node from each set of nodes from said first set of sets of nodes.

2. The method of claim 1, wherein determining a set of nodes corresponding to said at least one of said one or more incorrect values includes:

designating said selected test patterns as target faults;

simulating each said target fault against a fault machine to generate simulated fail patterns; and determining if any of said simulated fail patterns matches said selected test pattern.

3. The method of claim 2, wherein determining said set of nodes corresponding to said at least one at least one of said one or more incorrect values further includes performing a trace back starting from a failing logic block output and terminating at a previous latch.

4. The method of claim 1, wherein determining said first set of sets of nodes further includes:

determining the size of each of said sets of nodes;

determining a set of minimal sets of nodes, said minimal sets of nodes having a minimal size; and discarding all sets or nodes having a size higher than said minimal set size.

5. The method of claim 4, further comprising:

determining whether there is a second set of sets of nodes such that each minimal set of said set of minimal sets of nodes corresponds to a set of nodes obtained by taking one node from each set of nodes from said second set of sets of nodes and such that each set of nodes obtained by taking one node from each set of nodes from said second set of sets of nodes corresponds to one minimal set of nodes from said set of minimal sets of nodes.

6. The method of claim 1, further comprising testing said integrated circuit to obtain said set of failing test patterns.

7. A method for diagnosing defects in an integrated circuit comprising:

(a) providing a set of failing test patterns, each failing test pattern comprising a set of values, one or more of said values being incorrect compared to a corresponding value of a set values from a corresponding expected set of passing test patterns;

(b) selecting a failing test pattern from said set of failing patterns;

(c) creating one or more single stuck-at fault target faults, said target faults including single stuck-at faults that could cause at least one of said one or more incorrect values of said failing test pattern and adding said target faults to a set of target faults;

(d) selecting a target fault from said set of target faults;

(e) simulating said selected target fault against a fault machine to create a simulated fail pattern;

(f) comparing said simulated fail pattern to said selected fail pattern;

(g) if said simulated fail pattern matches said selected failing pattern, determining a set of nodes corresponding to said at least one of said one or more incorrect values, a node being a connection between two gates or two latches or a gate and a latch of said circuit and adding said set of nodes to an explaining node list for said selected failing pattern, otherwise going to step (h);

(h) repeating steps (d) through (g) until all target faults in said set of target faults have been selected;

(i) repeating stops (b) through (h) until all failing test patterns in said set of failing test patterns have been selected;

(j) selecting in turn, the nodes associated with each failing test pattern from said explaining node list and creating explaining sets of nodes for each failing test pattern; and (k) for each failing text pattern, selecting a first set of said sets of explaining nodes such that all incorrect values of each failing test pattern could be caused by a stuck-at zero or a stuck-at one on at least one node from each set of nodes from said first set of sets of nodes.

8. The method of claim 7, wherein said target faults are generated using a set of main faults generated from a logic design corresponding to said integrated circuit, said main faults comprising at least all stuck-at faults on all nodes in the design of said integrated circuit design.

9. The method of claim 7, wherein creating one or more single stuck-at fault target faults includes performing a trace back starting from a failing logic block output and terminating at a previous logic block.

10. The method of claim 7, wherein determining said first set of said sets of nodes further includes:

determining the size of each of said sets of nodes;

determining a set of minimal sets of nodes, said minimal sets of nodes having a minimal size; and discarding all sets of nodes having a size higher than said minimal set size.

11. The method of claim 10, further comprising:

determining whether there is a second set of sets of nodes such that each minimal set of said set of minimal sets of nodes corresponds to a set of nodes obtained by taking one node from each set of nodes from said second set of sets of nodes and such that each set of nodes obtained by taking one node from each set of nodes from said second set of sets of nodes corresponds to one minimal set or nodes from said set of minimal sets of nodes.

12. The method of claim 7, further comprising testing said integrated circuit to obtain said set of failing test patterns.

* * * * *